US011943592B2

(12) United States Patent
Ceballos et al.

(10) Patent No.: US 11,943,592 B2
(45) Date of Patent: Mar. 26, 2024

(54) SINGLE TO DIFFERENTIAL CONVERSION IN SILICON MICROPHONE AMPLIFIERS

(71) Applicant: Infineon Technologies AG, Neubiberg (DE)

(72) Inventors: Jose Luis Ceballos, Villach (AT); Hong Chen, Villach (AT); Fulvio CiCiotti, Villach (AT); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 171 days.

(21) Appl. No.: 17/658,716

(22) Filed: Apr. 11, 2022

(65) Prior Publication Data

US 2023/0328433 A1    Oct. 12, 2023

(51) Int. Cl.
| | |
|---|---|
| H04R 3/02 | (2006.01) |
| H03F 3/45 | (2006.01) |
| H04R 19/04 | (2006.01) |
| H04R 29/00 | (2006.01) |

(52) U.S. Cl.
CPC .......... *H04R 3/02* (2013.01); *H03F 3/45475* (2013.01); *H04R 19/04* (2013.01); *H04R 29/004* (2013.01); *H03F 2200/03* (2013.01); *H04R 2201/003* (2013.01)

(58) Field of Classification Search
CPC ........ H04R 3/02; H04R 19/04; H04R 29/004; H04R 2201/003; H03F 3/45475; H03F 2200/03; H03F 3/187
USPC ..... 381/58, 111–117, 120, 122; 330/10, 251, 330/207 A, 199, 297
See application file for complete search history.

(56) References Cited

U.S. PATENT DOCUMENTS

| | | | | |
|---|---|---|---|---|
| 6,057,737 | A | 5/2000 | Pritchard | |
| 7,397,287 | B2 * | 7/2008 | Makihara | H03M 1/0607 327/91 |
| 9,143,104 | B2 | 9/2015 | Sakai | |
| 10,250,208 | B2 * | 4/2019 | Marino | H03F 3/187 |
| 10,439,572 | B1 * | 10/2019 | Thompson | H03M 1/403 |
| 10,531,213 | B2 * | 1/2020 | Wilson | G01R 23/09 |

(Continued)

FOREIGN PATENT DOCUMENTS

CN    105898655 B    5/2017

OTHER PUBLICATIONS

K.S. Rakshitdatta et al., "A 12.5 mW, 11.1 nV/√Hz, -115 dB THD, < 1 μs Settling, 18 bit SAR ADC Driver in 0.6 μm CMOS" IEEE Transactions on Circuits and Systems—II: Express Briefs, vol. 63, No. 5, May 2016, pp. 443-447.

*Primary Examiner* — Xu Mei
(74) *Attorney, Agent, or Firm* — Slater Matsil, LLP

(57) ABSTRACT

A single-ended to differential converter includes a converter input, a first converter output, a second converter output, and an internal node, wherein the first converter output and the second converter output comprise a differential output; a non-inverting amplifier having an input coupled to the converter input, and an output coupled to the first converter output; an inverting amplifier having an input coupled to the first converter output, and an output coupled to the second converter output; a charge pump having a charge pump output capacitor coupled between the second converter output and the internal node; and a feedback capacitor coupled between the first converter output and the internal node.

20 Claims, 8 Drawing Sheets

(56) References Cited

U.S. PATENT DOCUMENTS

| | | | |
|---|---|---|---|
| 11,095,303 B1* | 8/2021 | Wagemans | H03M 3/32 |
| 2009/0316935 A1 | 12/2009 | Furst et al. | |
| 2016/0352294 A1* | 12/2016 | Nicollini | B06B 1/0292 |
| 2022/0416743 A1* | 12/2022 | Modaffari | H03F 3/70 |

* cited by examiner

SINGLE TO DIFFERENTIAL CONVERSION IN SILICON MICROPHONE AMPLIFIERS

TECHNICAL FIELD

The present invention relates generally to single-to-differential conversion in silicon microphone amplifiers, and to a corresponding system and method.

BACKGROUND

Silicon based microphones (SiMic) or "digital microphones" are known in the art. Digital microphones typically include a microelectromechanical systems (MEMS) device responsive to sound waves for generating an analog signal, an amplifier such as a programmable gain amplifier (PGA) for amplifying the analog signal, an analog to digital converter (ADC) for converting the analog signal into a digital signal, and subsequent digital components for further processing of the digital signal. Single-ended and differential PGAs are also known in the art. The signal to noise ratio of the digital microphone can be adversely affected by noise generated in the PGA.

SUMMARY

According to an embodiment, a single-ended to differential converter includes a converter input, a first converter output, a second converter output, and an internal node, wherein the first converter output and the second converter output include a differential output; a non-inverting amplifier having an input coupled to the converter input, and an output coupled to the first converter output; an inverting amplifier having an input coupled to the first converter output, and an output coupled to the second converter output; a charge pump having a charge pump output capacitor coupled between the second converter output and the internal node; and a feedback capacitor coupled between the first converter output and the internal node.

According to an embodiment, an integrated circuit includes a first converter pin, a first converter output, a second converter output, and a second converter pin, wherein the first converter output and the second converter output include a first differential output; a non-inverting amplifier having an input coupled to the first converter pin, and an output coupled to the first converter output; an inverting amplifier having an input coupled to the first converter output, and an output coupled to the second converter output; a charge pump having a charge pump output capacitor coupled between the second converter output and the second converter pin; and a feedback capacitor coupled between the first converter output and the second converter pin.

According to an embodiment, a conversion method includes in a converter including a converter input, a first converter output, a second converter output, and an internal node, wherein the first converter output and the second converter output include a differential output, sensing an input voltage at the converter input; generating a noninverting first output voltage at the first converter output in response to the sensed input voltage; sensing the noninverting first output voltage at the first converter output; generating an inverting second output voltage at the second converter output in response to the noninverting first output voltage; coupling a charge pump output capacitor between the second converter output and the internal node; and coupling a feedback capacitor between the first converter output and the internal node.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

Single-ended MEMs microphone signals can be converted to differential signals to ensure good power supply rejection (PSR) performance in the digital microphone. According to embodiment ideas, PGA gain is increased in the "frontend" of the digital microphone (as close to the input pin as possible) in order to maximize SNR. This is accomplished using an extremely low noise PGA amplifier that is described in detail below, according to embodiments.

In operation, the low noise PGA amplifier combines a capacitive feedback source-follower-based PGA, together with an inverting stage which drives the "ground" of a charge pump filtering capacitance. In this way, the noise of the inverter stage becomes common mode and is cancelled out in a differential processing. In embodiments, the inverter stage can be a low-power inverter stage.

Figure 1:
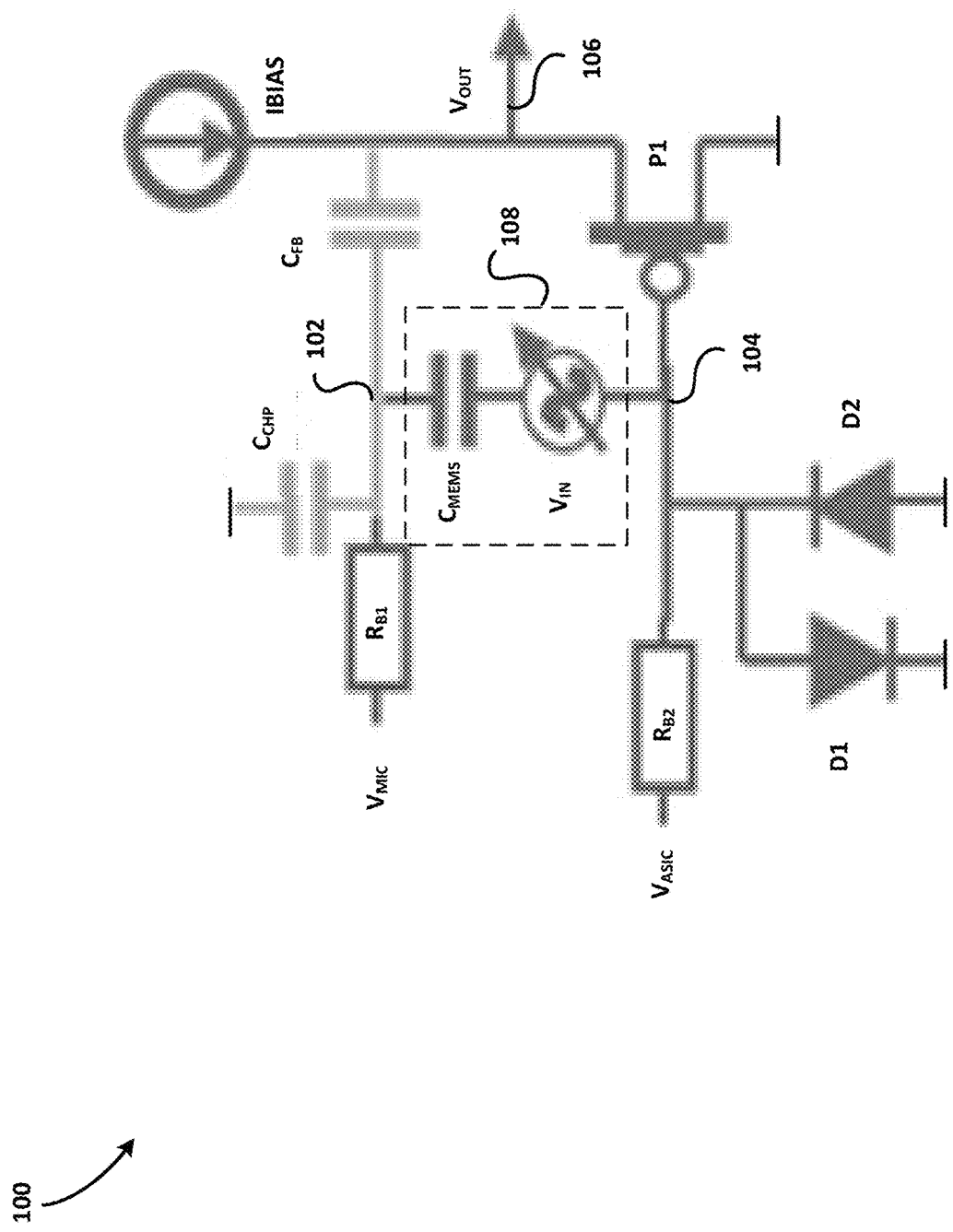
FIG. 1 is a schematic diagram of an exemplary single-ended PGA for use in a digital microphone.

FIG. 1 shows a simplified schematic of an exemplary single-ended source-follower-based amplifier 100. Amplifier 100 includes a P-channel transistor P1 used in a source-follower configuration. The gate of transistor P1 is coupled to input node 104, the source of transistor P1 is coupled to the output node 106, and the drain of transistor P1 is coupled to ground or other DC voltage source. A bias current source IBIAS is coupled to output node 106 for providing a bias current to transistor P1. The gate of transistor P1 is coupled to diodes D1 and D2 for clamping the input voltage of amplifier 100. A MEMS device 108, which is represented by a capacitor $C_{MEMS}$ and an analog input voltage $V_{IN}$, is coupled between node 102 and input node 104. A feedback capacitor $C_{FB}$ is coupled between node 102 and output node 106, and a charge pump capacitor $C_{CHP}$ is coupled between node 102 and ground or another DC voltage source. Capacitor $C_{CHP}$ is used to filter out the charge-pump biasing voltage ripple of the unfiltered VMIC biasing voltage. Capacitors $C_{FB}$ and $C_{CHP}$ determine the gain of amplifier 100, which is given by the equation $V_{OUT}=(1+C_{FB}/C_{CHP})*V_{IN}$.

While amplifier 100 shown in FIG. 1 provide good performance for amplifying the analog signal of the MEMS device 108, the single-ended output can be converted to a differential output having improved noise performance in a differential PGA described in further detail below, according to embodiments. The differential PGA can be used in a digital microphone product having an improved SNR.

Figure 2:
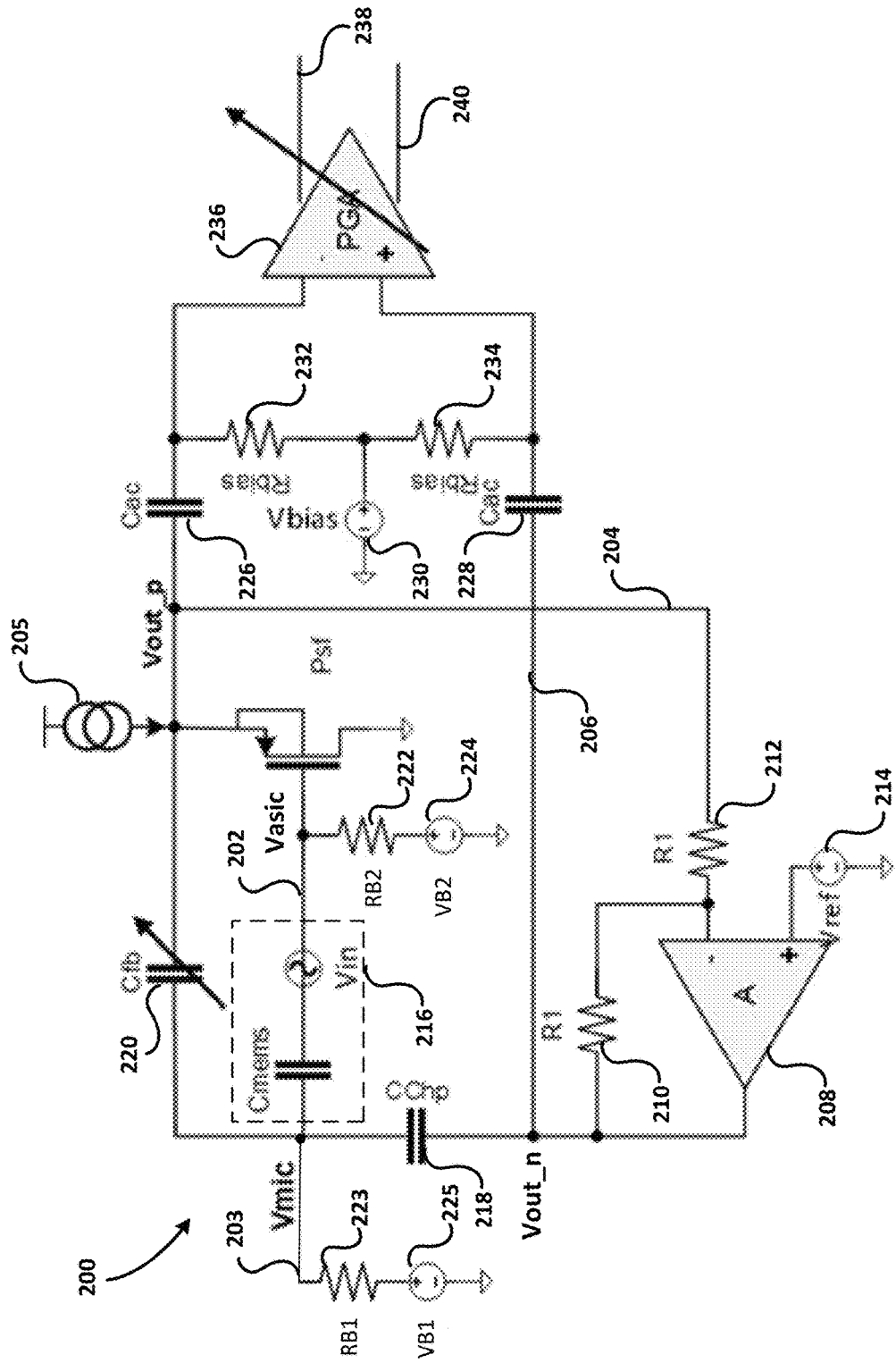
FIG. 2 is a schematic diagram of a differential PGA for use in a digital microphone, according to an embodiment.

FIG. 2 is a schematic diagram of an improved noise differential PGA 200 having low noise performance, according to an embodiment. In PGA 200A, charge pump capacitor $C_{CHP}$ is boosted with the inverted output of an inverting amplifier in order to improve noise performance as will be explained in further detail below. Subsequent stages can be AC or DC coupled, can be programmable, and can be fully or pseudo-differential. While a single transistor source follower stage is shown in FIG. 2, other source follow topologies can be used for the source follower.

PGA 200 includes a P-channel transistor PSF in a source-follower configuration having a source coupled to a first output node 204 for providing the Vout_p output voltage, a gate coupled to input node 202, which is biased to the $V_{ASIC}$ DC bias voltage, and a drain coupled to ground or to another DC voltage source. The source of transistor $P_{SF}$ is biased by the current provided by current source 205. Capacitors $C_{FB}$ and $C_{CHP}$ determine the gain of amplifier 100, which is given by the equation Vout_p=$(1+C_{FB}/C_{CHP})*V_{IN}$. Capacitor 220 ($C_{FB}$) can be made adjustable, in an embodiment. Capacitor 220 is coupled between nodes 204 and 203, and charge pump capacitor 218 ($C_{CHP}$) is coupled between nodes 203 and nodes 206. A MEMS device 216, shown as a MEMS capacitor $C_{MEMS}$ and an input voltage $V_{IN}$, is coupled between nodes 202 and 203. A first biasing resistor $R_{B1}$ 223 is coupled between node 203 and a source of bias voltage $V_{B1}$ 225. The $V_{B1}$ bias voltage represents an unfiltered charge pump voltage $V_{MIC}$, and the voltage at node 203 represents the filtered charge pump voltage $V_{MIC}$. A second biasing resistor $R_{B2}$ is coupled between node 202 and a source of bias voltage $V_{B2}$ 224. The $V_{B2}$ bias voltage represents an unfiltered charge pump voltage $V_{ASIC}$, and the voltage at node 202 represents the filtered charge pump voltage $V_{ASIC}$.

The Vout_p output voltage is amplified by a unity gain inverting operational amplifier 208 having a gain determined by the ratio of resistors 210 and 212. Since the value of resistors 210 and 212 having the same value of R1, the overall gain is negative one. Operational amplifier has a negative input coupled to resistors 210 and 212, and a positive input coupled to a reference voltage source $V_{REF}$. The output of operational amplifier 208 provides the Vout_n output voltage at node 206. Nodes 204 and 206 form a first differential output of PGA comprises voltages Vout_p and Vout_n.

PGA 200 includes a differential output circuit comprising a differential coupling circuit, a differential biasing circuit, and a differential PGA stage 236. The differential coupling circuit comprises $C_{AC}$ coupling capacitor 226 coupled between node 204 and the negative input of PGA stage 236, and $C_{AC}$ coupling capacitor 228 coupled between node 206 and the positive input of PGA stage 236. The differential biasing circuit comprises a third bias resistor $R_{BIAS}$ 232 coupled between the negative input of PGA stage 236 and a source of $V_{BIAS}$ bias voltage 230, and a fourth bias resistor $R_{BIAS}$ 234 coupled between the positive input of PGA 236 and the source of $V_{BIAS}$ bias voltage 230. PGA 236 provides a second buffered differential output at node 238 and node 240. While a fully differential output circuit is shown in FIG. 2, other output circuits can be provided as previously discussed, including other fully differential output circuits, pseudo-differential output circuits, and even single-ended output circuits in embodiments.

Figure 3:
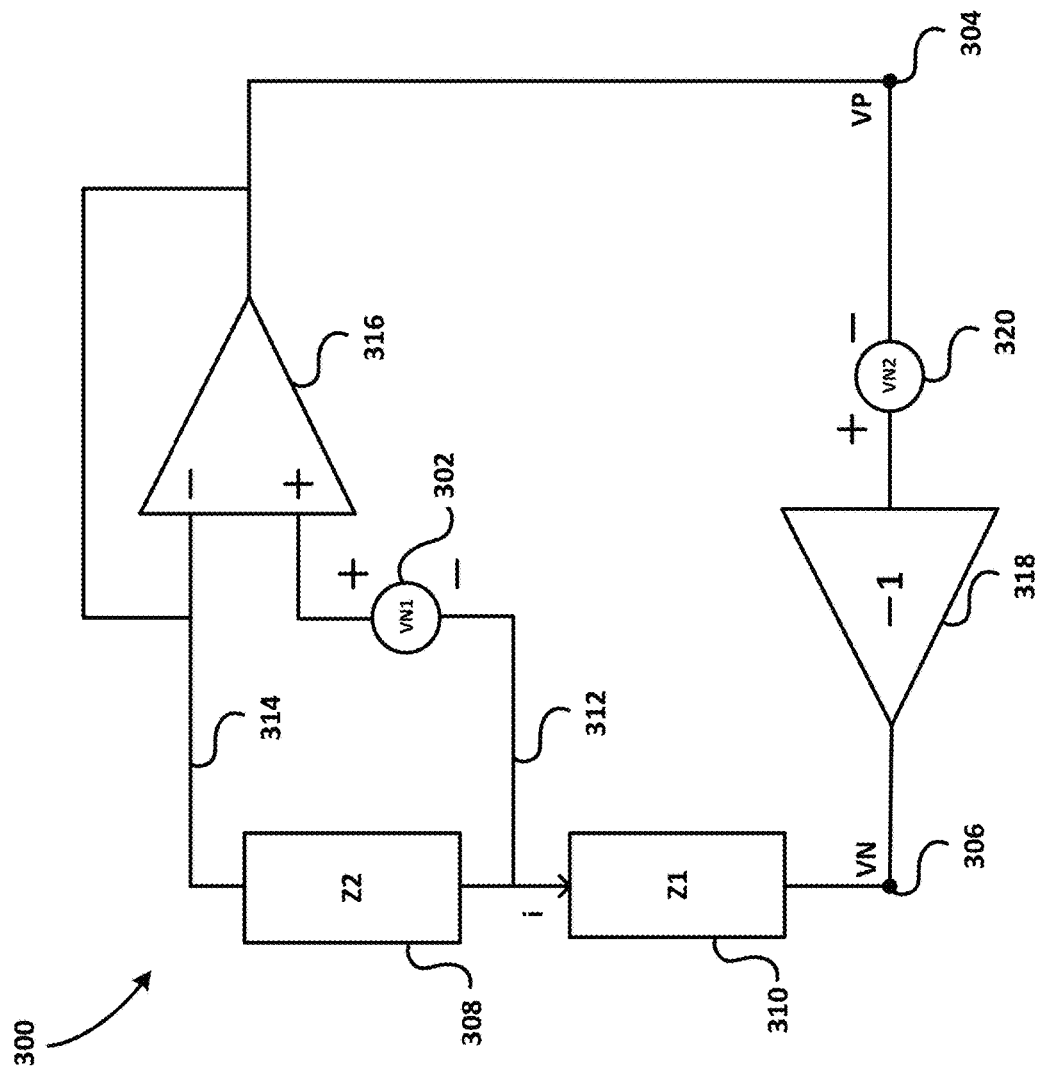
FIG. 3 is a schematic diagram of an equivalent circuit of the differential PGA of FIG. 2.

FIG. 3 is a schematic diagram of an equivalent circuit 300 corresponding to the differential PGA of FIG. 2 including a unity gain noninverting amplifier 316 having an output coupled to VP node 304, and an inverting amplifier 318 coupled between VP node 304 and VN node 306. The biasing resistors, MEMS device, and differential output circuit are omitted in FIG. 3 for the sake of clarity. Equivalent circuit 300 also includes a first impedance Z1 310 that corresponds to charge pump capacitor $C_{CHP}$ previously discussed, and a second impedance Z2 308 that corresponds to feedback capacitor $C_{FB}$ previously discussed. First impedance Z1 310 is coupled between VN node 306 and node 312, and second impedance Z2 308 is coupled between node 312 and node 314. A current "i" flows through first impedance Z1 310 and second impedance Z2 308. In equivalent circuit 300, voltage source VN1 302 represents the input voltage and voltage source VN2 320 represents the noise voltage associated with inverting amplifier 318. The gain of the equivalent circuit is thus given by the equation (VP−VN)=VN1*(1+Z2/Z1). From an inspection of FIG. 3 it can be noted that the noise voltage VN2 is subtracted out from the differential output voltage (VP−VN) as the noise voltage is a common mode voltage component, such that the overall noise component is lowered with respect to the amplifier 100 shown in FIG. 1.

Figure 4:
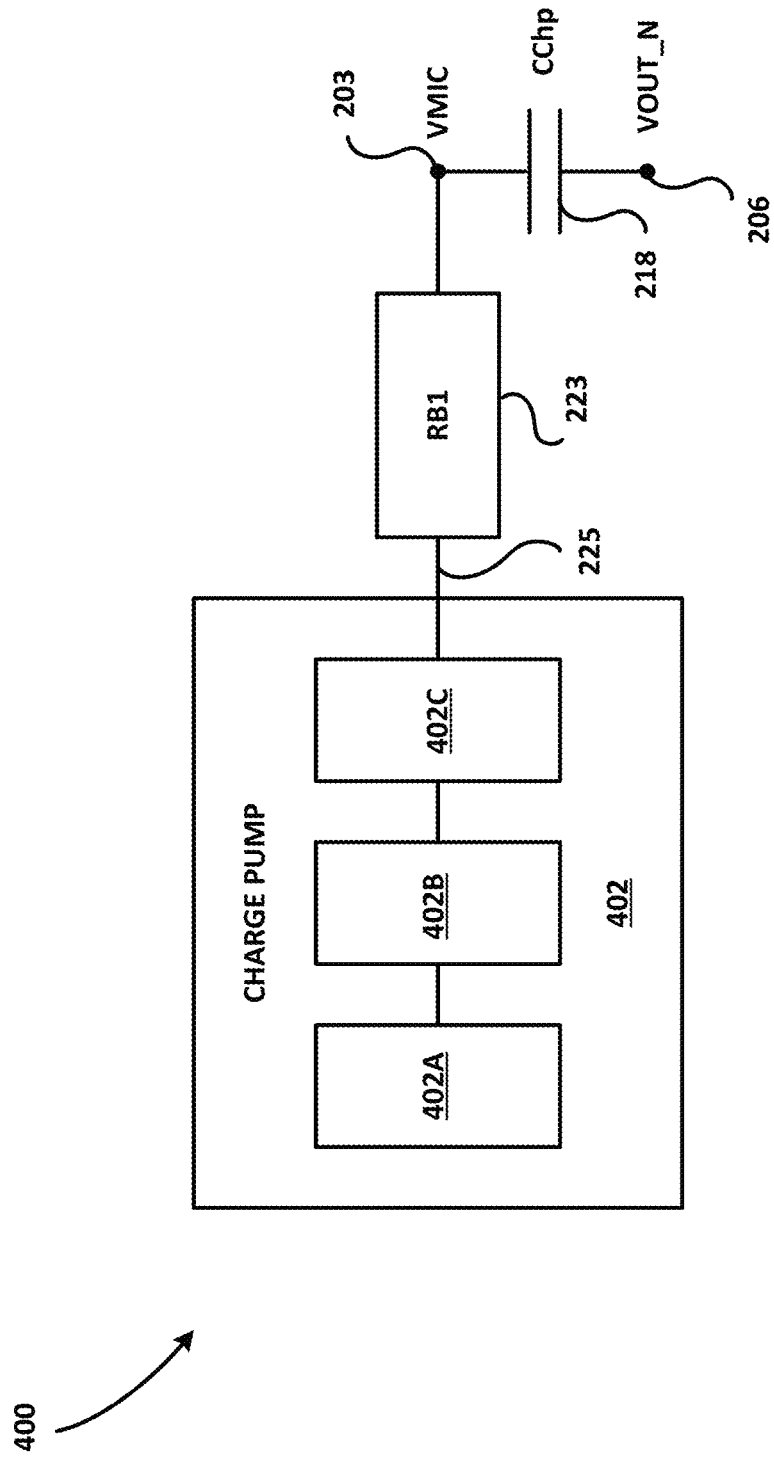
FIG. 4 is a schematic diagram of a charge pump and a floating filter used in the differential PGA of FIG. 2, according to an embodiment.

FIG. 4 is a schematic diagram 400 of a charge pump 402 and a floating filter including resistor 223 and capacitor 218 used in the differential PGA 200 of FIG. 2, according to an embodiment. Charge pump 402 can comprise a Dickson charge pump circuit comprising a plurality of charge pump stages 402A, 402B, and 402C. While three such stages are shown any number of stages can be used in embodiments. The charge pump stages can comprise either diode or transistor charge pump stages. Other types of charge pumps can also be used. An unfiltered charge pump output voltage is provided at node 225. A filtered charge pump voltage is provided at node 203 by the action of the low pass floating filter comprising biasing resistor $R_{B1}$ 223 and the charge pump capacitor $C_{CHP}$ 218, which can also be referred to herein as a "charge pump output capacitor" since it is coupled to the output of charge pump 402 through biasing resistor $R_{B1}$ 223.

Figure 5A:
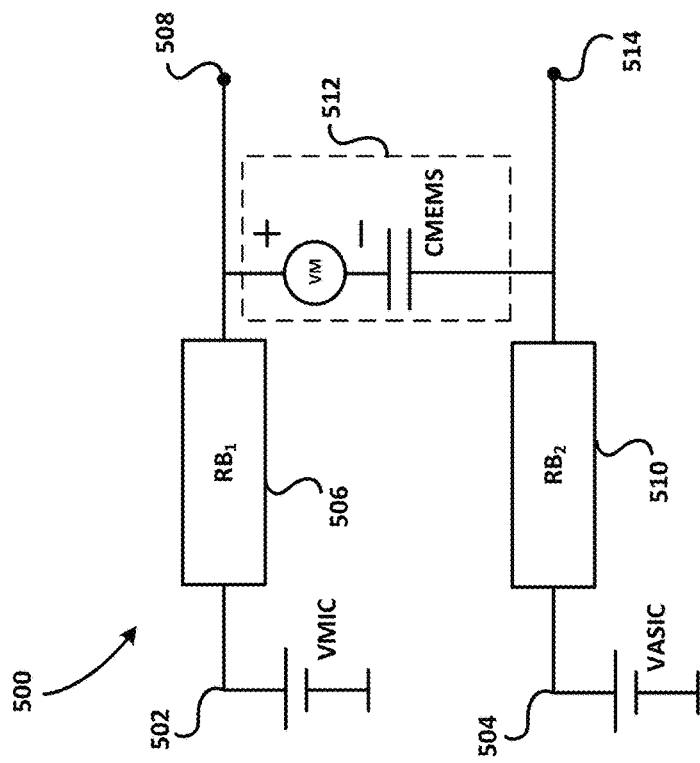
FIGS. 5A and 5B are schematic diagrams of alternative biasing arrangements for a MEMS device used with the differential PGA shown in FIG. 2, according to embodiments.
Figure 5B:
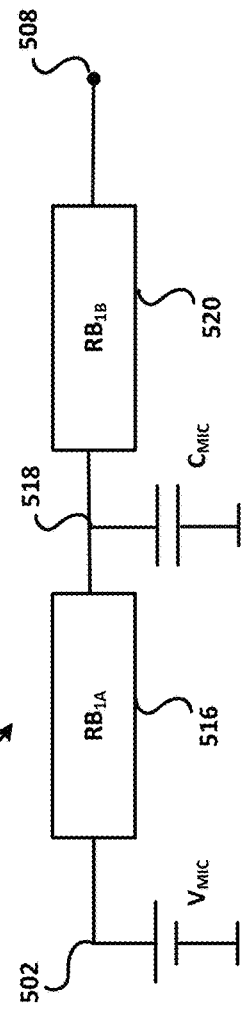

FIGS. 5A and 5B are schematic diagrams of alternative biasing arrangements for a MEMS device used with the differential PGA 200 shown in FIG. 2, according to embodiments. While the schematics shown in FIGS. 5A and 5B generally correspond to the differential PGA 200 shown in FIG. 2, many of the components of differential PGA 200 are omitted for the sake of clarity. A first biasing arrangement 500 is shown in FIG. 5A, wherein a first voltage $V_{MIC}$ is applied to a first biasing resistor $R_{B1}$ 506 at node 502, and a second voltage $V_{ASIC}$ is applied to a second biasing resistor $R_{B2}$ 510 at node 504. The first voltage VMIC and the second voltage $V_{ASIC}$ can be supplied by charge pumps of the type shown in FIG. 4. Biasing resistor 506 is coupled to node 508, which corresponds to node 203 in FIG. 2, and biasing resistor 510 is coupled to node 514, which corresponds to node 202 in FIG. 2. A MEMS device 512, represented by capacitor $C_{MMS}$ and voltage source $V_M$, is coupled between nodes 508 and 514. A second biasing arrangement 550 is shown in FIG. 5B, wherein the first biasing resistor RB1 is replaced by two biasing resistors $R_{B1A}$ 516 and $R_{B1B}$ 520 in series between nodes 502 and 508. A capacitor CMIC is coupled to the common node 518 between biasing resistors 516 and 520. The second biasing arrangement shown in FIG. 5B provides additional filtering, and can also be used with respect to the second biasing resistor $R_{B2}$ 510, in some embodiments.

Figure 6:
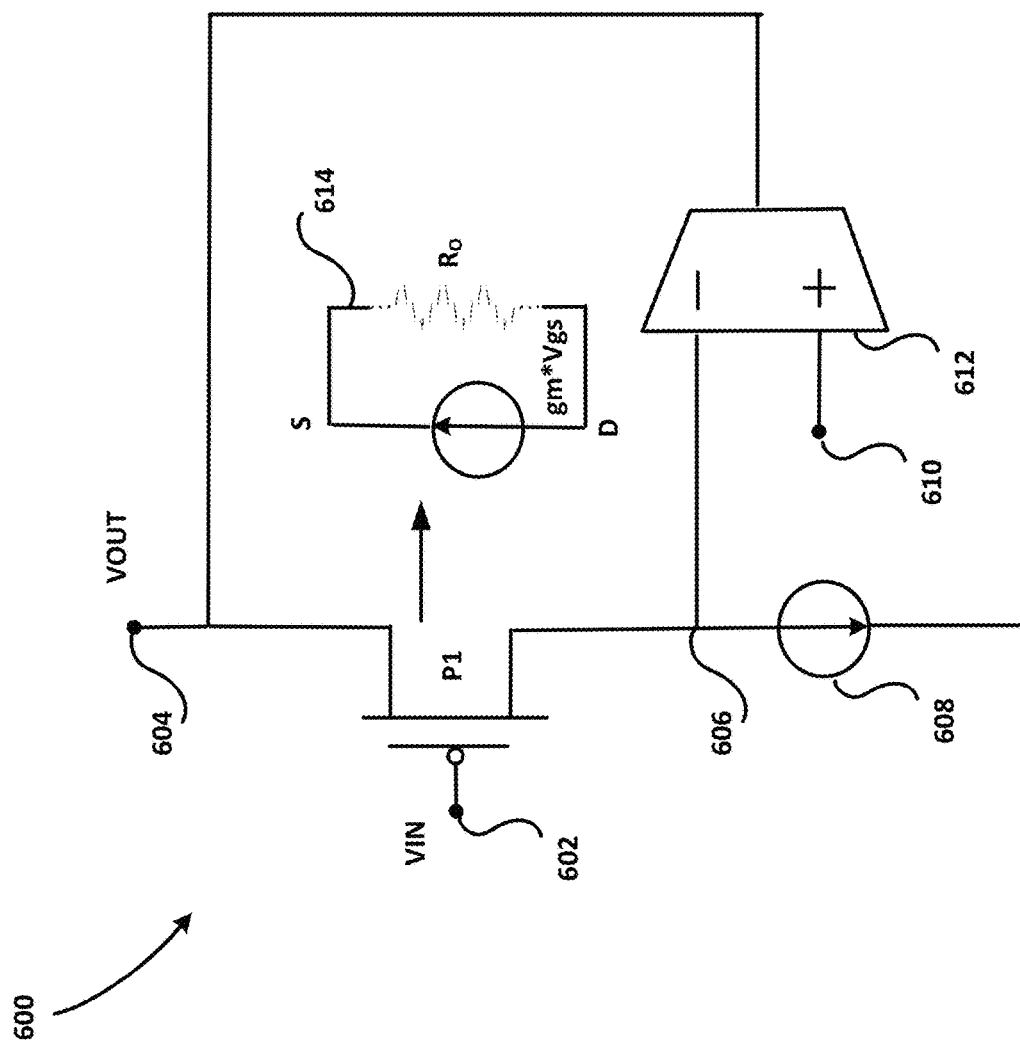
FIG. 6 is a schematic diagram of alternative source follower stage including a transconductance stage.

FIG. 6 is a schematic diagram of alternative source follower stage 600 including a transconductance stage 612, according to an embodiment, that can be used in the differential PGA 200 shown in FIG. 2. Source follower stage 600 includes P-channel transistor P1 having a source coupled to node 604 for providing an output voltage VOUT, a gate coupled to node 602 for receiving an input voltage VIN, and a drain coupled to node 606. A current source 608 is also coupled to node 606 for providing a bias current. A transconductance stage 612 has a negative input coupled to node 606, a positive input coupled to a reference voltage node 610, and an output coupled to node 604. An equivalent model 614 is shown in FIG. 6, including a current source gm*Vgs in parallel with a resistor R0. The gain of source follower stage 600 is thus given by the equation VOUT/VIN=gm*R0/(gm*R0+1), which is approximately unity gain.

Figure 7:
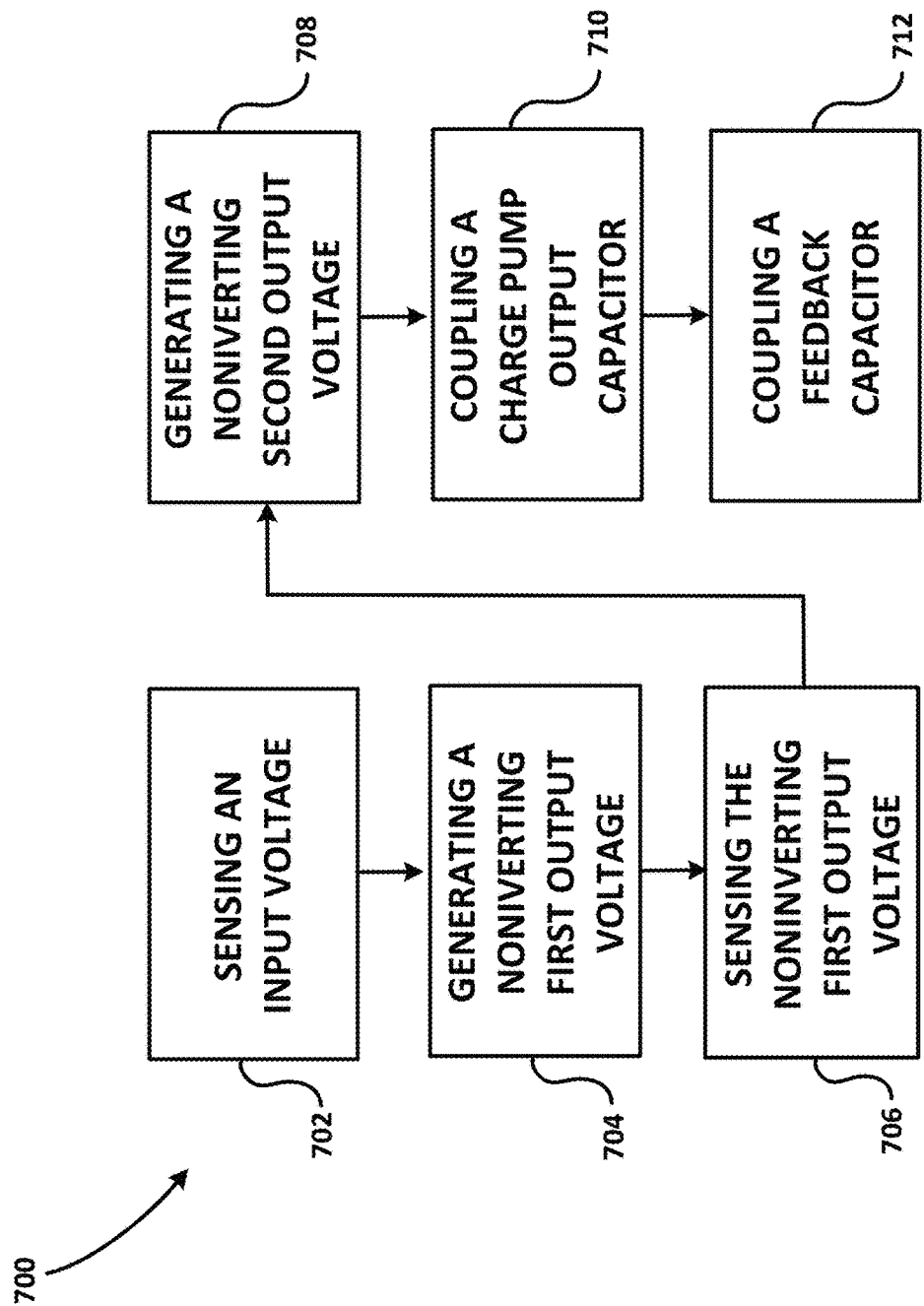
FIG. 7 is a flowchart of a low noise amplification method, according to an embodiment.

FIG. 7 is a flowchart of a low noise amplification method 700, according to an embodiment, including, in a converter including a converter input, a first converter output, a second converter output, and an internal node, wherein the first converter output and the second converter output comprise a differential output, sensing an input voltage at the converter input at step 702; generating a noninverting first output voltage at the first converter output in response to the sensed input voltage 704; sensing the noninverting first output voltage at the first converter output at step 706; generating an inverting second output voltage at the second converter output in response to the noninverting first output voltage at step 708; coupling a charge pump output capacitor between the second converter output and the internal node at step 710; and coupling a feedback capacitor between the first converter output and the internal node at step 712.

Figure 8:
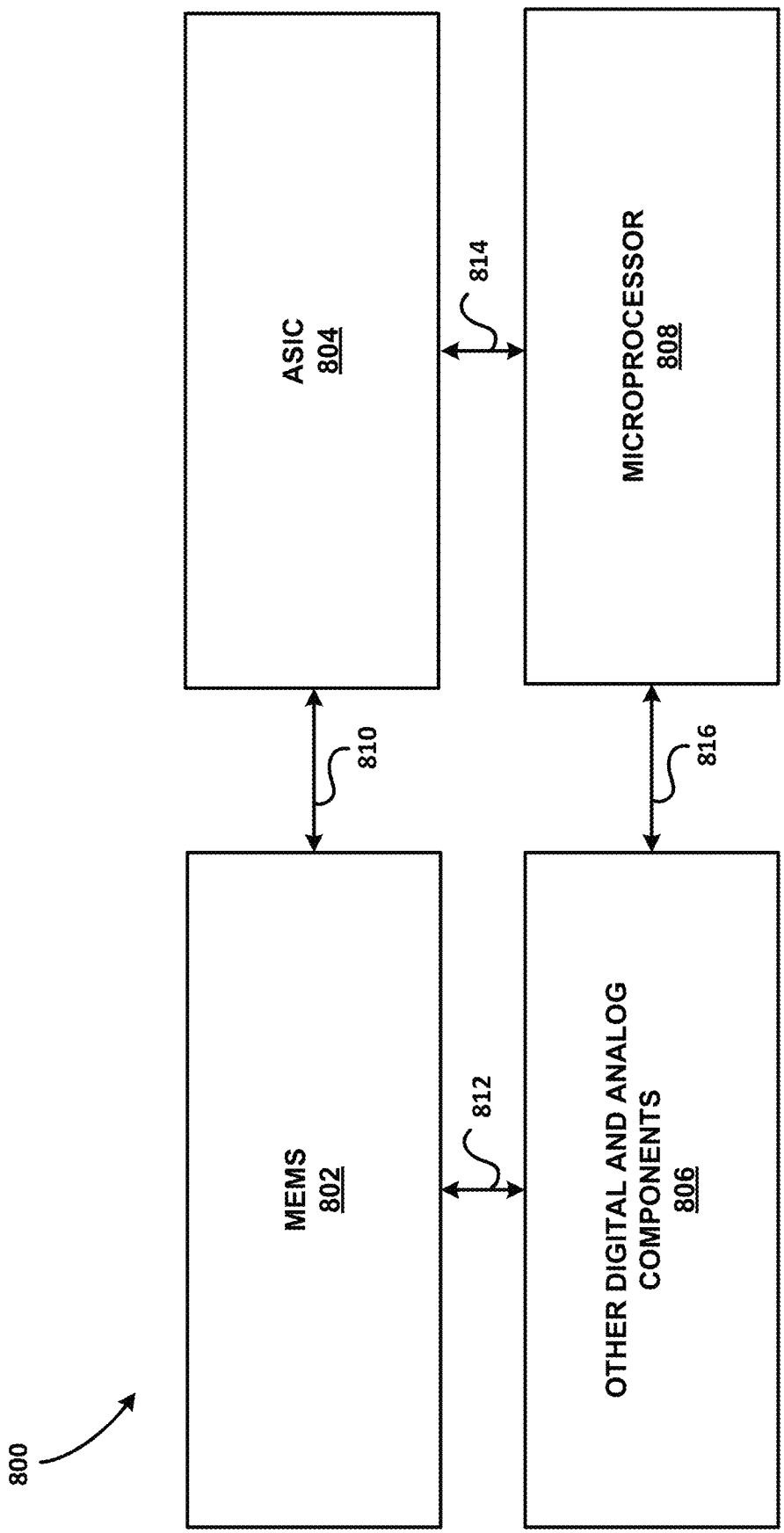
FIG. 8 is a block diagram of a digital microphone product, according to an embodiment.

FIG. 8 is a block diagram of a digital microphone product 800 including a low noise differential PGA as described above, according to an embodiment. Digital microphone product 800 includes MEMS device 802 and ASIC 804. MEMS device can comprise a capacitive MEMS device that generates an analog voltage in response to received sound waves. ASIC 804 can comprise the low noise differential PGA, an ADC, as well as other signal processing circuitry. The MEMS device 802 and ASIC 804 are in communication via bidirectional bus 810. MEMS device 802 and ASIC 804 can be packaged together to form a single digital product, such as a digital microphone. In some embodiments, digital microphone product 800 can also include other digital and analog components 806, such as additional filters, amplifiers, and other similar components. The other digital and analog components 806 can communicate with MEMS device 802 through bidirectional bus 812. In some embodiments, digital microphone product 800 can also include a microprocessor 808, which can communicate with ASIC 804 and the other digital and analog components 806 through bidirectional bus 814 and bidirectional bus 816. For example, microprocessor 808 can generate clock signals and receive data from ASIC 804. In other embodiments, microprocessor 808 can provide the functionality of digital or software components that would otherwise be resident on ASIC 804.

Example embodiments of the present invention are summarized here. Other embodiments can also be understood from the entirety of the specification and the claims filed herein.

Example 1. According to an embodiment, a single-ended to differential converter includes a converter input, a first converter output, a second converter output, and an internal node, wherein the first converter output and the second converter output include a differential output; a non-inverting amplifier having an input coupled to the converter input, and an output coupled to the first converter output; an inverting amplifier having an input coupled to the first converter output, and an output coupled to the second converter output; a charge pump having a charge pump output capacitor coupled between the second converter output and the internal node; and a feedback capacitor coupled between the first converter output and the internal node.

Example 2. The single-ended to differential converter of Example 1, wherein the non-inverting amplifier includes a source follower.

Example 3. The single-ended to differential converter of any of the above examples, wherein the source follower includes a P-channel transistor.

Example 4. The single-ended to differential converter of any of the above examples, further including a current source coupled to the first converter output.

Example 5. The single-ended to differential converter of any of the above examples, further including a transconductance component coupled to the source follower.

Example 6. The single-ended to differential converter of any of the above examples, wherein the inverting amplifier includes an operational amplifier having a first resistor coupled to an inverting input of the operational amplifier, and a second resistor coupled between the inverting input of the operational amplifier and an output of the operational amplifier.

Example 7. The single-ended to differential converter of any of the above examples, wherein the first resistor and the second resistor have equal values.

Example 8. The single-ended to differential converter of any of the above examples, wherein the charge pump is coupled to the internal node through a first bias resistor.

Example 9. The single-ended to differential converter of any of the above examples, wherein the feedback capacitor includes an adjustable value capacitor.

Example 10. The single-ended to differential converter of any of the above examples, further including a MEMS device coupled between the internal node and the converter input.

Example 11. The single-ended to differential converter of any of the above examples, wherein the MEMS device includes a capacitive MEMS device configured for converting sound waves into an analog voltage.

Example 12. The single-ended to differential converter of any of the above examples, further including a second bias resistor coupled to the converter input.

Example 13. The single-ended to differential converter of any of the above examples, further including a differential bias circuit coupled between the first converter output and the second converter output.

Example 14. The single-ended to differential converter of any of the above examples, wherein the differential bias circuit includes a third bias resistor and a fourth bias resistor, and wherein the third bias resistor and the fourth bias resistor have equal values.

Example 15. The single-ended to differential converter of any of the above examples, further including a differential output amplifier coupled between the first converter output and the second converter output.

Example 16. The single-ended to differential converter of any of the above examples, wherein the differential output amplifier includes a programmable gain amplifier.

Example 17. According to an embodiment, an integrated circuit includes a first converter pin, a first converter output, a second converter output, and a second converter pin, wherein the first converter output and the second converter output include a first differential output; a non-inverting amplifier having an input coupled to the first converter pin, and an output coupled to the first converter output; an inverting amplifier having an input coupled to the first converter output, and an output coupled to the second converter output; a charge pump having a charge pump output capacitor coupled between the second converter output and the second converter pin; and a feedback capacitor coupled between the first converter output and the second converter pin.

Example 18. The integrated circuit of Example 17, further including a differential input coupled between the first converter output and the second converter output, and a second differential output responsive to the differential input coupled between a third converter pin and a fourth converter pin.

Example 19. According to an embodiment, a conversion method includes in a converter including a converter input, a first converter output, a second converter output, and an internal node, wherein the first converter output and the second converter output include a differential output, sensing an input voltage at the converter input; generating a noninverting first output voltage at the first converter output in response to the sensed input voltage; sensing the noninverting first output voltage at the first converter output; generating an inverting second output voltage at the second converter output in response to the noninverting first output voltage; coupling a charge pump output capacitor between the second converter output and the internal node; and coupling a feedback capacitor between the first converter output and the internal node.

Example 20. The conversion method of Example 19, further including coupling a MEMS device between the second converter output and the internal node.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A single-ended to differential converter, comprising:
   a converter input, a first converter output, a second converter output, and an internal node, wherein the first converter output and the second converter output comprise a differential output;
   a non-inverting amplifier having an input coupled to the converter input, and an output coupled to the first converter output;
   an inverting amplifier having an input coupled to the first converter output, and an output coupled to the second converter output;
   a charge pump having a charge pump output capacitor coupled between the second converter output and the internal node; and
   a feedback capacitor coupled between the first converter output and the internal node.

2. The single-ended to differential converter of claim 1, wherein the non-inverting amplifier comprises a source follower.

3. The single-ended to differential converter of claim 2, wherein the source follower comprises a P-channel transistor.

4. The single-ended to differential converter of claim 2, further comprising a current source coupled to the first converter output.

5. The single-ended to differential converter of claim 2, further comprising a transconductance component coupled to the source follower.

6. The single-ended to differential converter of claim 1, wherein the inverting amplifier comprises an operational amplifier having a first resistor coupled to an inverting input of the operational amplifier, and a second resistor coupled between the inverting input of the operational amplifier and an output of the operational amplifier.

7. The single-ended to differential converter of claim 6, wherein the first resistor and the second resistor have equal values.

8. The single-ended to differential converter of claim 1, wherein the charge pump is coupled to the internal node through a first bias resistor.

9. The single-ended to differential converter of claim 1, wherein the feedback capacitor comprises an adjustable value capacitor.

10. The single-ended to differential converter of claim 1, further comprising a MEMS device coupled between the internal node and the converter input.

11. The single-ended to differential converter of claim 10, wherein the MEMS device comprises a capacitive MEMS device configured for converting sound waves into an analog voltage.

12. The single-ended to differential converter of claim 1, further comprising a second bias resistor coupled to the converter input.

13. The single-ended to differential converter of claim 1, further comprising a differential bias circuit coupled between the first converter output and the second converter output.

14. The single-ended to differential converter of claim 13, wherein the differential bias circuit comprises a third bias resistor and a fourth bias resistor, and wherein the third bias resistor and the fourth bias resistor have equal values.

15. The single-ended to differential converter of claim 1, further comprising a differential output amplifier coupled between the first converter output and the second converter output.

16. The single-ended to differential converter of claim 15, wherein the differential output amplifier comprises a programmable gain amplifier.

17. An integrated circuit, comprising:
- a first converter pin, a first converter output, a second converter output, and a second converter pin, wherein the first converter output and the second converter output comprise a first differential output;
- a non-inverting amplifier having an input coupled to the first converter pin, and an output coupled to the first converter output;
- an inverting amplifier having an input coupled to the first converter output, and an output coupled to the second converter output;
- a charge pump having a charge pump output capacitor coupled between the second converter output and the second converter pin; and
- a feedback capacitor coupled between the first converter output and the second converter pin.

18. The integrated circuit of claim 17, further comprising a differential input coupled between the first converter output and the second converter output, and a second differential output responsive to the differential input coupled between a third converter pin and a fourth converter pin.

19. A conversion method, comprising:
- in a converter comprising a converter input, a first converter output, a second converter output, and an internal node, wherein the first converter output and the second converter output comprise a differential output,
- sensing an input voltage at the converter input;
- generating a noninverting first output voltage at the first converter output in response to the sensed input voltage;
- sensing the noninverting first output voltage at the first converter output;
- generating an inverting second output voltage at the second converter output in response to the noninverting first output voltage;
- coupling a charge pump output capacitor between the second converter output and the internal node; and
- coupling a feedback capacitor between the first converter output and the internal node.

20. The conversion method of claim 19, further comprising coupling a MEMS device between the second converter output and the internal node.

\* \* \* \* \*